(12) United States Patent
Bonora et al.

(10) Patent No.: US 7,737,567 B2
(45) Date of Patent: Jun. 15, 2010

(54) METHOD AND APPARATUS FOR WAFER MARKING

(75) Inventors: Anthony C. Bonora, Fremont, CA (US);
Raymond S. Martin, Fremont, CA (US); Michael Krolak, Fremont, CA (US)

(73) Assignee: Crossing Automation, Inc., Fremont, CA (US)

( * ) Notice: Subject to any disclaimer, the term of this patent is extended or adjusted under 35 U.S.C. 154(b) by 0 days.

(21) Appl. No.: 12/143,197

(22) Filed: Jun. 20, 2008

(65) Prior Publication Data
US 2009/0001616 A1    Jan. 1, 2009

Related U.S. Application Data

(60) Provisional application No. 60/945,847, filed on Jun. 22, 2007.

(51) Int. Cl.
*H01L 23/544* (2006.01)
*B65H 1/00* (2006.01)

(52) U.S. Cl. ............... 257/797; 414/222.01; 414/806; 438/14; 438/975; 257/E23.179

(58) Field of Classification Search ............... 257/797, 257/E23.179; 414/222.01, 806; 438/14, 438/975
See application file for complete search history.

(56) References Cited

U.S. PATENT DOCUMENTS

| 5,966,201 A | 10/1999 | Shiraishi et al. ............ 355/53 |
| 6,973,370 B2 | 12/2005 | Ito et al. ............ 700/218 |

FOREIGN PATENT DOCUMENTS

JP         08172033 A   *   7/1996

\* cited by examiner

*Primary Examiner*—Victor A Mandala
*Assistant Examiner*—Whitney Moore
(74) *Attorney, Agent, or Firm*—Martine Penilla & Gencarella, LLP

(57) ABSTRACT

A semiconductor substrate is provided. The substrate includes a first surface and an opposing second surface, wherein the first surface includes a marking in a centroid region of the first surface. The marking indicates a location of a center point on the first surface of the semiconductor substrate or identification data unique to the substrate. A system, methods of transporting and marking, and a device for reading the substrate markings are also provided.

26 Claims, 8 Drawing Sheets

மெthod AND APPARATUS FOR WAFER MARKING

CLAIM OF PRIORITY

The present application claims priority under 35 U.S.C. §119(e) from U.S. Provisional Patent Application No. 60/945,847, filed Jun. 22, 2007, which are incorporated by reference in their entirety for all purposes.

BACKGROUND

Semiconductor wafers have typically been marked with unique identification codes along the wafer periphery. As critical dimensions continue to shrink and the edge exclusion zone takes on more importance, the marking of the wafer is being reevaluated. As processes are changing and customization to certain wafers is being explored, the information captured through the markings on the wafer is important.

Accordingly, it would be beneficial to maintain the availability of the information provided by the wafer marking but capture the information in a manner that would enhance throughput, reduce handling, improve readability, minimize misreads and be able to withstand the harsh processing conditions experienced by the wafer.

SUMMARY

Broadly speaking, the present invention fills these needs by providing a method and apparatus for a wafer backside center identification mark. It should be appreciated that the present invention can be implemented in numerous ways, including as a method, a system, or an apparatus. Several inventive embodiments of the present invention are described below.

In one embodiment, a substrate transport system is provided. The system includes a substrate having a marking located within a central region of a surface of the substrate. The marking identifies a center point of the substrate. A transport mechanism for transporting the substrate over a transport path is included. The system includes a sensing element configured to capture the marking from the surface of the substrate as the substrate is transported over the path and a computing device configured to process the captured marking to identify the center point.

Yet another aspect of the present invention provides a semiconductor substrate. The semiconductor substrate includes a first surface and an opposing second surface. The first surface includes a marking indicating a location of a center point of the semiconductor substrate or a marking indicating an orientation of the semiconductor substrate.

Still another embodiment of the present invention includes a scan arm configured to read semiconductor substrate markings. The scan arm includes an extension extending from a support member. The extension includes a sensor configured to read markings on a surface of a semiconductor substrate. The sensor is disposed in a relief area of the extension. The sensor detects fiducial positions on a center region surface of the semiconductor substrate as the extension scans the surface of the substrate when the substrate is supported within a container.

In another embodiment, a semiconductor substrate support is provided. The semiconductor substrate support includes a base having a support surface configured to support a semiconductor substrate. The support surface has a recess area. An image capture device is disposed within the recess area. The image capture device is configured to capture an image of markings on a surface of the semiconductor substrate. The markings identify a center point and angular orientation of the semiconductor substrate disposed on the semiconductor substrate support.

In another embodiment, a device configured to read semiconductor substrate markings is provided. The device includes a sensor element located within a support member and positioned to capture the markings on center region of a surface of a semiconductor substrate, wherein the markings provide a unique identifier of the semiconductor substrate.

In yet another embodiment, a method for transporting a substrate is provided, the method includes obtaining the substrate from a substrate container. The method includes transporting the substrate to a processing tool wherein a center region of a surface of the substrate passes over a sensor. The transporting includes reading position indicating markings on the center region of the surface of the substrate and identifying a center point of the substrate from the position indicating markings. A drop off position to the processing tool is adjusted based on the identified center point.

In still yet another embodiment, a method for marking a semiconductor substrate is provided. The method includes identifying a center point of the substrate and identifying a crystallographic plane of the substrate. A marking indicating a location of one of the center point, an angular rotation relative to the crystallographic plane or a unique identifier is scribed onto a surface of the substrate. The scribing is performed in a center region of a surface of the semiconductor substrate.

Other aspects and advantages of the invention will become apparent from the following detailed description, taken in conjunction with the accompanying drawings, illustrating by way of example the principles of the invention.

BRIEF DESCRIPTION OF THE DRAWINGS

Aspects of the present invention will become apparent from the following detailed description, taken in conjunction with the accompanying drawings, illustrating by way of example the principles of the invention.

DETAILED DESCRIPTION

Figure 1:
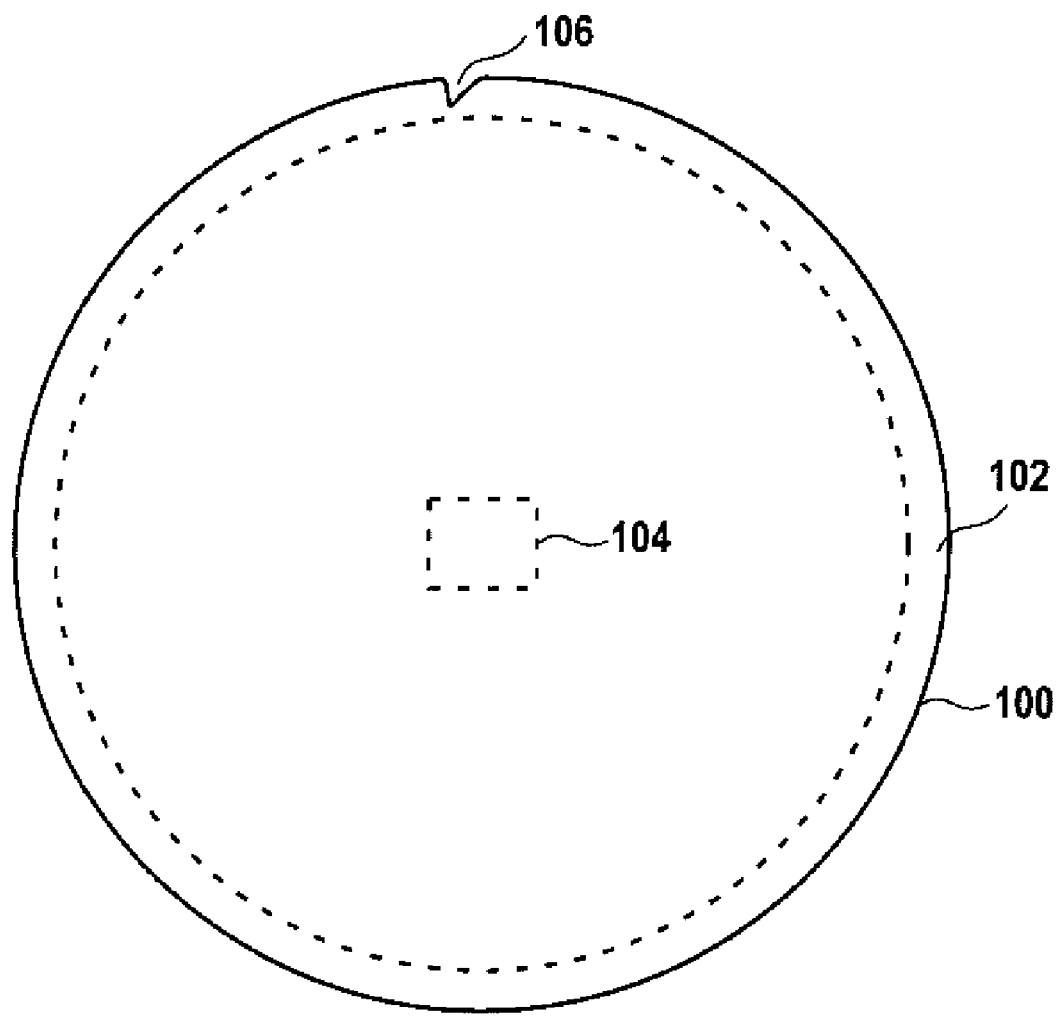
FIG. 1 is a simplified schematic diagram illustrating a wafer having a position indicating mark and/or identification mark in accordance with one embodiment of the invention.

An invention is described for a system and method for marking substrates used in semiconductor manufacturing operations. It will be obvious, however, to one skilled in the art, that the present invention may be practiced without some or all of these specific details. In other instances, well known process operations have not been described in detail in order not to unnecessarily obscure the present invention.

The embodiments described herein provide for placing an identification mark or position indicating mark on either a back side or front side of a wafer for identification and location purposes in one embodiment of the invention. In one embodiment, the mark is located in a center region or center portion of the substrate. Thus, the mark may be located along a centroid of the substrate or proximate to the centroid. As used herein, the center region or center portion of the substrate may be referred to as a centroid or center of mass. While the embodiments illustrate a circular substrate or wafer, the embodiments are not to be construed as limited to a circular wafer, as any of the embodiments described herein may be extended to any geometric shaped wafer. For example, some semiconductor substrates, such as flat panel displays or solar panels, may be of a quadrilateral shape. In these substrates the marks described herein are located on a center region/portion or centroid of the quadrilateral.

It should be appreciated that as feature sizes are becoming smaller and smaller the edge region of the wafer, also referred to as the edge exclusion zone, is becoming more important. Previously marks for identification of wafers have been located in the edge exclusion zone of the wafer. However, as this edge exclusion zone is shrinking and processes are changing, the placement of the mark in the edge exclusion zone is becoming more difficult as well as being obscured by the processing operations. In addition, the need to cycle the wafer in order to locate the mark in the edge exclusion zone costs precious time for each wafer processing operation as well as enhancing traceability. If this time could be eliminated or minimized, the cumulative savings for the processing of numerous wafers would be significant. In addition, there is a trend to move away from edge gripper end effectors because of the potential for damage of the edge area as the edge exclusion zone shrinks. Accordingly, the ability to eliminate the need to cycle the wafer to locate the edge marking would assist in the move away from edge grippers. A move away from edge markings also benefits the trend toward single wafer processing and the customization of processes for a particular wafer. That is, as processes are able to adapt in technology advances, some processes may be customized or slightly adjusted depending on the characteristics of the wafer. In order to track this, each wafer must be capable of being identified. The embodiments described herein allow for the easy tracking of the wafer through the processing steps.

As described further below, the markings on the center region provide information as to the location of a center point of the substrate, the crystallographic orientation of the substrate, as well as a unique identifier of the substrate. One skilled in the art will appreciate that the center point and crystallographic orientation information may be used for alignment and processing operations performed on the substrate, while the unique identifier may be used for quality control, tracking, and product traceability purposes. In one embodiment, position indicating markings within the center region may guide a sensor or image capture device to the identification markings.

FIG. 1 is a simplified schematic diagram illustrating a wafer having a position indicating mark and/or identification mark in accordance with one embodiment of the invention. Wafer 100 has a center region mark 104 which will relay information concerning the location and orientation (X,Y,θ) of the wafer in one embodiment. That is, notch 106 within edge exclusion area 102 may provide an angular orientation/crystallographic orientation reference point for the mark within center region 104 of wafer 100 in one embodiment. That is, the marking(s) may provide a reference as to the location of notch 106 and notch 106 may be used to provide the angular orientation or crystallographic orientation of the substrate. Thus, reading the notch can be used to identify the crystallographic orientation in accordance with one embodiment. One skilled in the art will appreciate that the crystallographic orientation is relevant for silicon substrates. In another embodiment, the notch may be eliminated and the marking(s) may indicate the angular orientation/crystallographic orientation. It should be appreciated that center region 104 may be located on a front side of the substrate or a back side of the substrate. As used herein, the front side of the substrate contains the regions which are exposed and processed during the semiconductor manufacturing operations, such as etching, deposition, etc., while the back side of the substrate opposes the front side. It should be appreciated that the area covered by the marking may be 100 microns by 100 microns in one embodiment. However, this is not meant to be limiting as the area covered by the marking may be smaller or larger depending on the application.

Figure 2A:
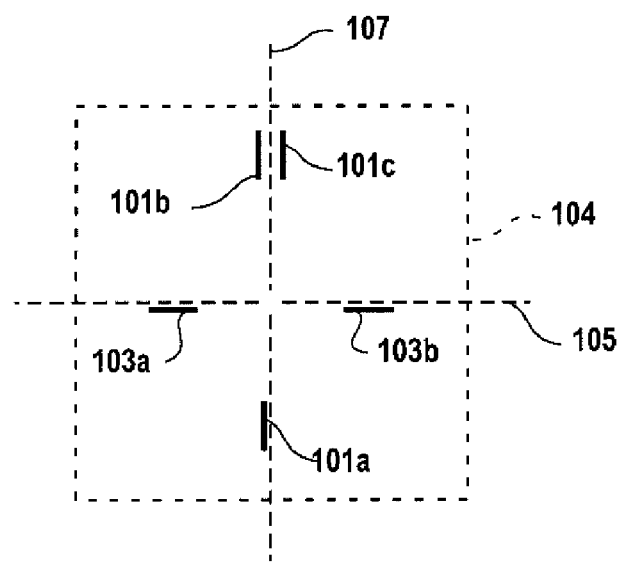
FIGS. 2A and 2B are simplified schematic diagrams illustrating exemplary marks which may be included within center region 104.
Figure 2B:
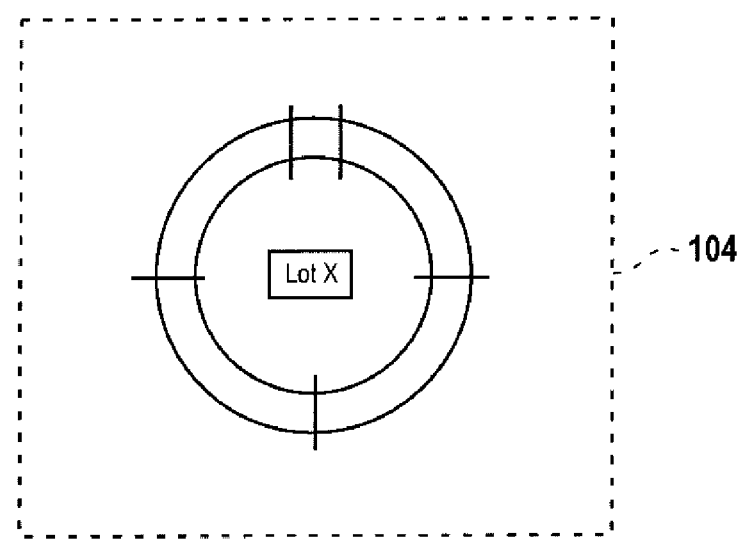

FIGS. 2A and 2B are simplified schematic diagrams illustrating exemplary marks which may be included within center region 104. In FIG. 2A, a plurality of fiducials is illustrated in order to provide an alignment and location of the wafer. Within region 104, a pair of fiducials 103a and 103b is located co-linearly with center line 105, while another fiducial 101a is located co-linearly with center line 107. It should be appreciated that center lines 105 and 107 are located within the same plane as the substrate surface. Within region 104, and parallel with center line 107, a pair of fiducials 101b and 101c is provided. The pair of fiducials 101b and 101c act to orient the wafer position in one embodiment, e.g., provide an angular orientation. That is, the pair of fiducials 101b and 101c will provide a direction as to a notch, or flat area, of the wafer or substrate as illustrated in FIG. 1 in accordance with one embodiment of the invention.

In one embodiment, where there is no notch on the wafer, the pair of fiducials 101b and 101c of FIG. 2A provide information relating to the underlying crystalline structure of the substrate, i.e., the crystallographic orientation of the substrate. For example, an x-ray may used to determine the crystallographic orientation of the 1,0,0 plane and a marking placed on the surface of substrate identifies this orientation. The marking(s) may be placed on the substrate by the supplier of the silicon wafer media. These markings can be engraved into recesses on a backside of the substrate/wafer or any other suitable technique may be used to provide the markings on the surface of the substrate, such as laser etching for bar codes, dot matrix, etc. The supplier of the silicon wafer may or may not include a notch on the wafer as described herein. In one embodiment, the supplier can determine a crystallographic orientation for the substrate through known techniques, such as x ray diffraction, and then place marking(s) on the substrate surface to indicate the crystallographic orientation. The use of x rays is not meant to be limiting as electron beam or optical energy may be used to determine the crystallographic orientation. The supplier can also provide marking(s) on the substrate that identify a location of a center point of the substrate. In another embodiment, the supplier can provide a unique identification, e.g., a lot number, etc., that is used to track the substrate through all of the processing to create integrated circuits from the substrate.

In FIG. 2B, the marking includes two concentric circles along with the fiducials of FIG. 2A. One skilled in the art will appreciate that the two concentric circles may be used to provide an indication as to a center point of the wafer as the back side or front side of the wafer is being scanned. That is, based on crossing one of one or more concentric circles, or concentric segments the direction of motion and the crossing section of one or both concentric circles will be used to indicate whether the scanning is proceeding to a center point, or is off a center point. Thus, the markings may include guides directing a scanner/reader to the center region where identification marks or additional location/orientation marks are provided. This information can then be used to either adjust the scanning to locate the center point, or adjust a process operation for which the wafer will undergo. The process operation may be any of the conventional processing operations performed on semiconductor substrates, such as etch, deposition, cleaning, etc. Thus, the wafer can be adjusted to be centered or the process can be adjusted knowing where the center of the wafer is located. In addition, the angular orientation provided by the embodiments described herein enable downstream processes to reproducibly align the substrate relative to a crystallographic plane or a peripheral mark, such as a notch.

One skilled in the art will appreciate that the markings of FIGS. 2A and 2B in conjunction with appropriate image recognition logic eliminate the need to rotate the wafer to locate the marks, therefore, the embodiments will enhance throughput. That is, since the fiducial for determining the angular orientation is located at a center region of the substrate rather than at an edge, the substrate does not need to be rotated to locate the fiducial. Thus, the notch may be eliminated, which in turn eliminates cost associated with cutting, beveling, polishing and inspecting the notch. As used herein, the term fiducial may refer to any marking or scribe that indicates an identifier for the substrate or position location, e.g., center point location or angular/crystallographic orientation. Exemplary markings are provided for illustrative purposes, however, the markings may be in any format. Other suitable markings/fiducials include barcodes, dot matrices, text/alphanumeric markings, etc. The markings of FIG. 2B indicate where a center point of the substrate is located and also provide a unique identifier for the substrate, e.g., Lot X.

Figure 3:
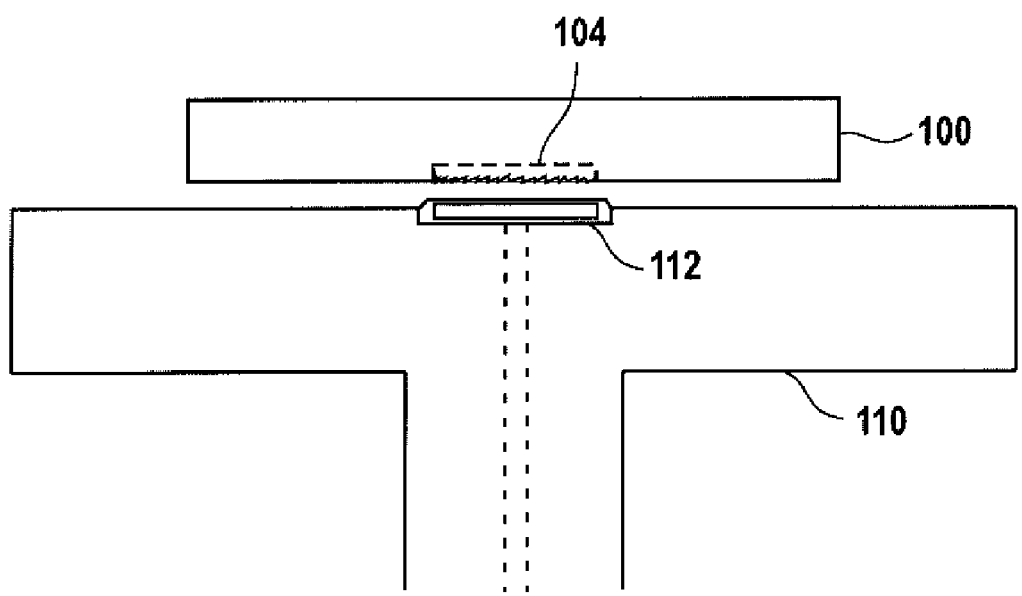
FIG. 3 is a simplified schematic diagram of a substrate support in which a visual identification apparatus is integrated thereon in order to identify a back side marking on a substrate in accordance with one embodiment of the invention.

FIG. 3 is a simplified schematic diagram of a substrate support in which a visual identification apparatus is integrated thereon in order to identify a back side marking on a substrate in accordance with one embodiment of the invention. Substrate support 110, which may be any suitable chuck used for processing in the semiconductor industry, includes recognition mechanism 112 for identifying a mark within a center region on a back side of wafer 100. It should be appreciated that a mark within center region 104 may be the markings provided in FIGS. 2A and 2B or may be any other suitable marking that identifies the wafer and/or identifies a position and orientation of the wafer on substrate 110. Of course the marking may be located at alternative positions to the center on either the front side or the back side of the wafer. Recognition device 112 will contain hardware such as a charged couple device (CCD) or a complimentary metal oxide semiconductor (CMOS) image capture device that will recognize, or capture the center region marking within region 104 for image analysis. In one embodiment substrate support 110 is rotatable and integrated into a mapper or aligner for a semiconductor processing tool. In this manner the substrate can be oriented for a particular process operation without having to spin the substrate to locate a notch. In another embodiment, the substrate support may be incorporated into a process chamber of a tool, such as a vacuum process chamber.

Figure 4:
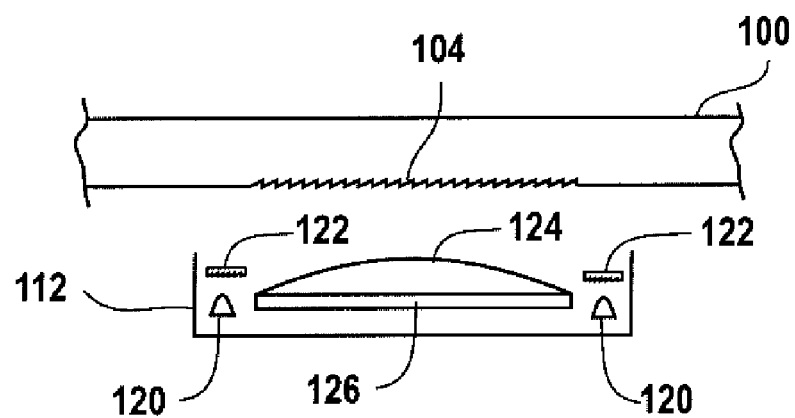
FIG. 4 provides the details of the recognition device in accordance with one embodiment of the invention.

FIG. 4 provides the details of the recognition device in accordance with one embodiment of the invention. Substrate 100 has a mark within center region 104. Substrate 100 is disposed over a suitable substrate support such as the substrate support 110 of FIG. 3. Recognition device 112 includes lens 124 or equivalent structure disposed over image capture device 126. As mentioned above, image capture device 126 may be a CCD or CMOS capture device. In order to accurately capture the marking within region 104, recognition device 112 may include light sources 120. Light sources 120 may be a visible or non-visible light emitting diode or some other suitable light source in order to provide photons that will enable an image to be captured. Diffusers 122 may be included in order to scatter photons so that an accurate or high resolution image may be captured in one embodiment of the invention. Alternatively, the light may be coaxial or confocal, i.e., where the light proceeds through lens 124 to the back side surface of substrate 100. It should be appreciated, that the field of interest, i.e., the capture area for the image capture/recognition device, can be enlarged or reduced as is necessary for the particular application.

Figure 5:
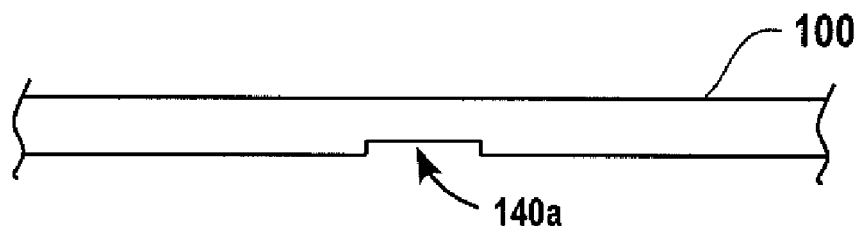
FIGS. 5 and 6 illustrate alternative embodiments of the markings provided to locate and orient a substrate in accordance with one embodiment of the invention.
Figure 6:
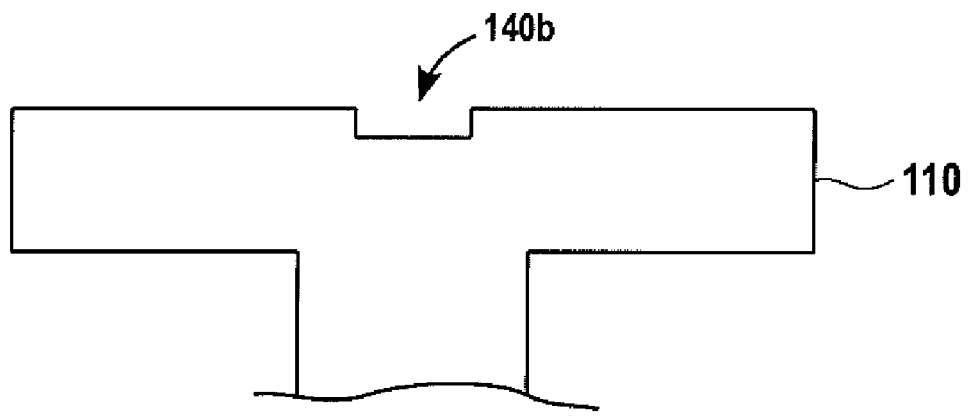

FIGS. 5 and 6 illustrate alternative embodiments of the markings provided to locate and orient a substrate in accordance with one embodiment of the invention. In FIG. 5, substrate 100 includes an indentation 140a (also referred to as a recess) where a mark may be placed, or in which the indentation may be used to locate and orient substrate 100. By placing a mark within indentation 140a, the mark will be somewhat protected from the processing occurring on substrate 100 and not cause any perturbations on the surface of the substrate that may impact the processing. In one embodiment, indentation 140a is about ⅟₁₀₀₀ of an inch recessed into the surface of substrate 100, however, this depth is meant to be exemplary and not limiting. Alternatively to the indentation within substrate 140a, a relief may be set into a substrate support supporting the wafer, such as the substrate support 110 of FIG. 6. In FIG. 6, relief 140b is provided in which an image capture device is disposed therein in order to capture the mark on the back side of the wafer as described above. One skilled in the art will appreciate that the image capture device may be in communication with a computing device to process the images captured in order to extract the information from the markings on the substrate surface. The computing device processes the image data or sensor signals to obtain the unique identifier for the substrate or the positional/orientation data for the substrate. One skilled in the art will appreciate that a center point can be readily ascertained or computed from the data provided through the markings and embodiments described herein.

Figure 7:
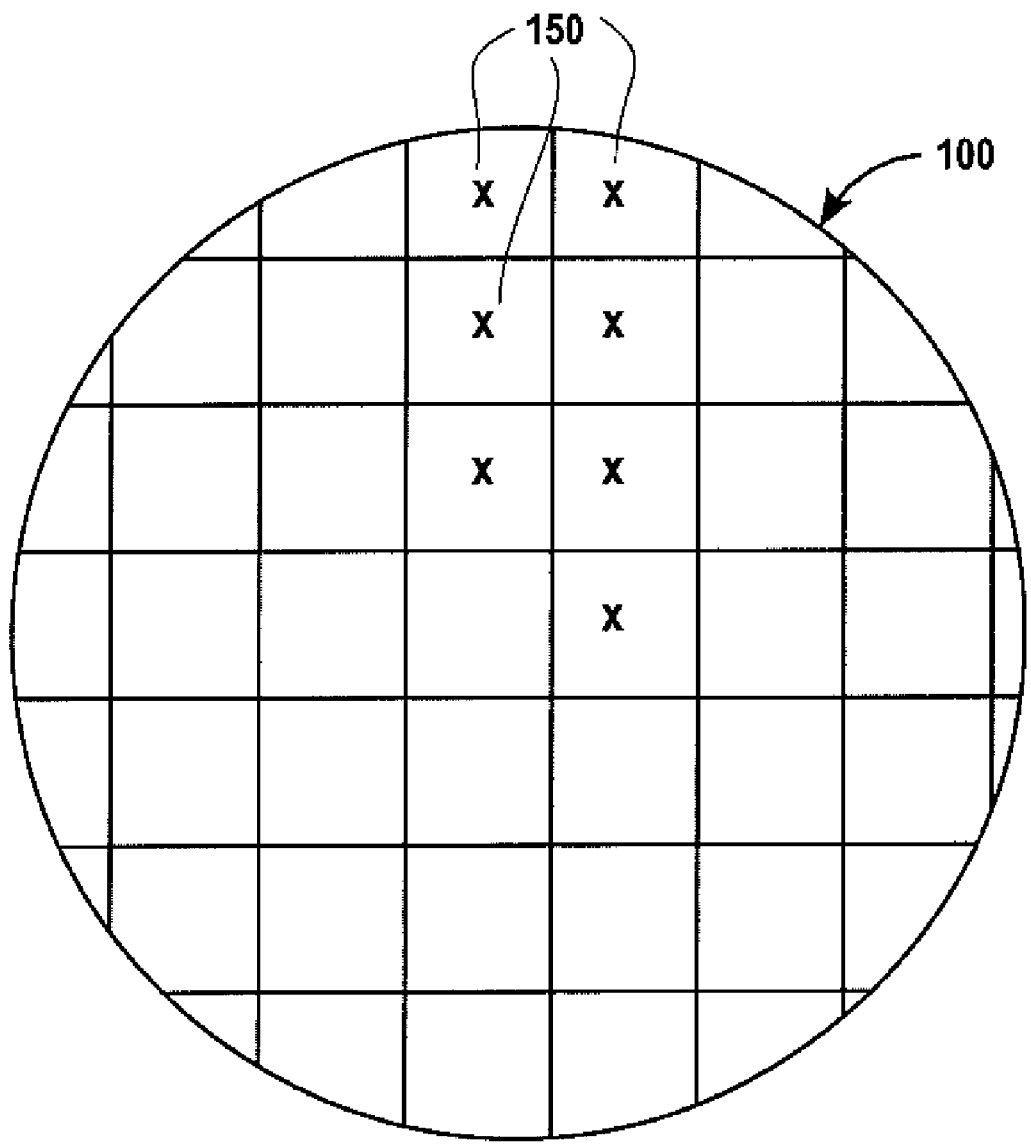
FIG. 7 is a simplified schematic diagram in which each die on a wafer is marked for tracking purposes in one embodiment of the invention.

FIG. 7 is a simplified schematic diagram in which each die on a wafer is marked for tracking purposes in one embodiment of the invention. It should be appreciated that as processing becomes more sophisticated, it may be desirable to track each die to the wafer that the die was processed from. In this embodiment, wafer 100 will include marking 150 on a back side of each die in accordance with one embodiment. Marking 150 may be used to correlate each die to a specific wafer for tracking purposes. In one embodiment, the each die on wafer 100 may be marked in a center position. Of course, each die can be marked in any suitable position and not necessarily in the center position. The markings described herein, such as marking 150 and the center region marks described for region 104 in the above figures may be any suitable mark which includes marks caused by heat deformation, ink printing, removal of any material from the back side, or addition of material to the back side or front side of the substrate. In addition, the marks may be alphanumeric or any geometric shape or other suitable identifiers.

Figure 8:
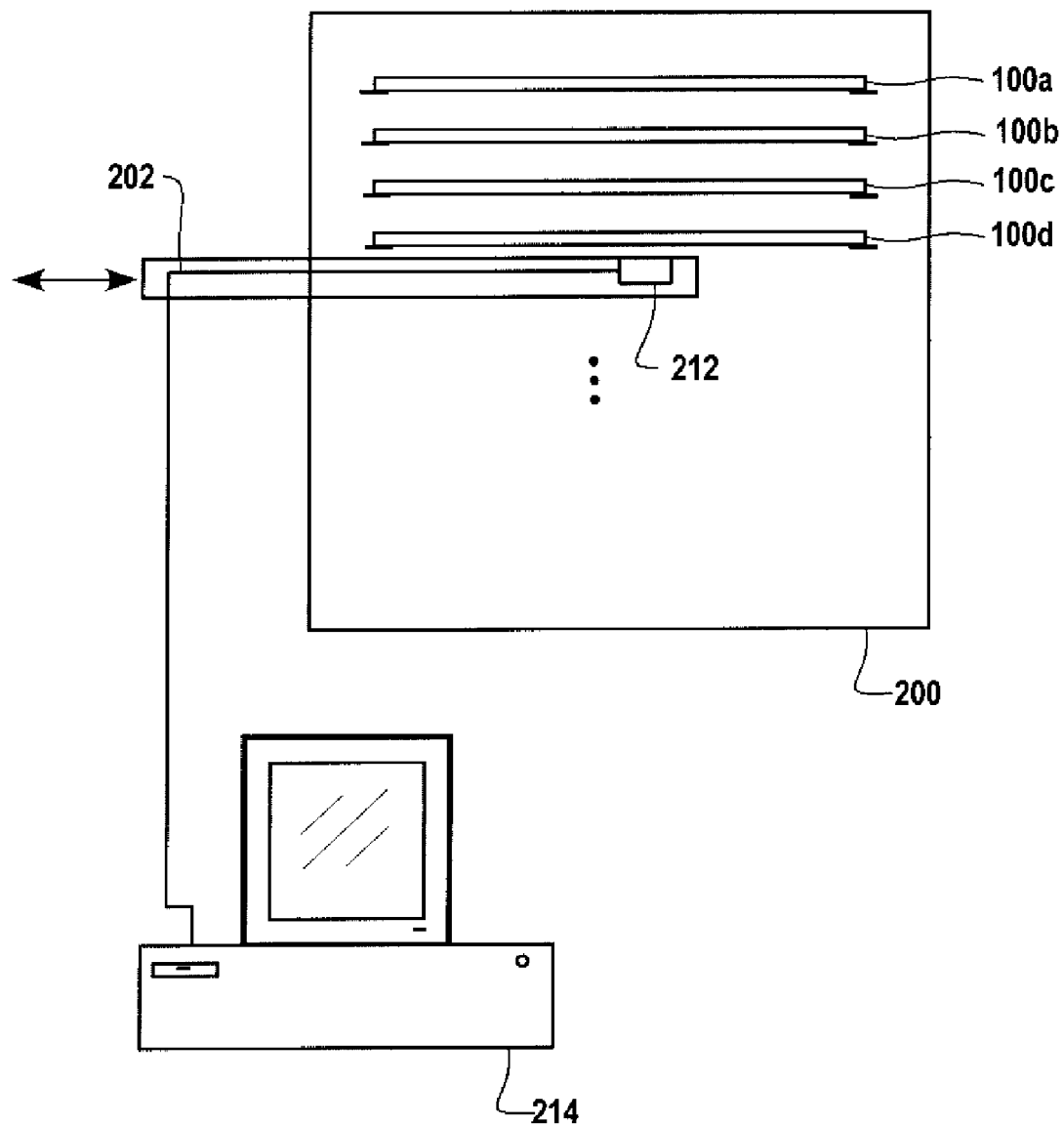
FIG. 8 is a simplified schematic diagram illustrating a reading system in accordance with one embodiment of the invention.

FIG. 8 is a simplified schematic diagram illustrating a reading system in accordance with one embodiment of the invention. A substrate carrier such as a front opening unified pod (FOUP) 200 includes a plurality of wafers 100a through 100d stored therein. In one embodiment, end effector 202 may have recognition device 212 incorporated therein on a first end of end effector 202. End effector 202 may simply be a blade which scans into and out of FOUP 200. The blade may be supported by a support member connected to a controller that controls the movement/scanning. In one embodiment, a plurality of blades may be supported by the support member to scan the substrates contemporaneously. For example, where the container holds 25 spaced apart substrates, 25 blades can scan across the substrate surfaces through the space between each substrate. The scanning into and out of FOUP 200 will enable the identification of substrates stored therein. In addition, end effector 202 may be used to scan and not touch any of substrates 100a through 100d. Thus, contamination issues are minimized in this embodiment.

Recognition device 212 of FIG. 8 may be any suitable image capture device capable of identifying or recognizing a marking on a surface of substrates 100a through 100d. In one embodiment, recognition device 212 may be the recognition device described above with reference to FIG. 4. Recognition device 212 is in communication with computing device 214. The image captured from recognition device 212 is analyzed by computing device 214 through image recognition logic or some other suitable software stored on computing device 214 so that the identification of each substrate may be tracked. Computing device 214 may include software having program instructions to execute the functionality described herein. Thus, from the information provided through the scanning, computing device 214 can calculate a center of the substrate and/or orient the substrate appropriately, as well as track the substrates through the unique identifier. In other embodiments, computing device 214 can store information concerning identification of the substrate or the dies of the substrate. It should be appreciated that the information captured from this embodiment may be used for a number of purposes. For example, as different processes are being introduced in foundries, it is important to separate copper substrates from non-copper substrates in order to prevent copper contamination. The embodiments described herein will enable further levels of control in order to ensure cross-contamination does not happen. That is, if the identifiers for substrates 100a through 100d indicate that the substrates are associated with a copper process, the scanning performed will ensure that the substrates do not enter a process in which the copper will contaminate a non-copper process.

In an alternative embodiment, a mark on the back side of the wafer may be sensed through a detection apparatus that is able to sense the mark from the front side of the wafer. For example, resistive properties of the marking, such as those detected through eddy current sensors may be sensed through a detection apparatus located above the front side of the wafer. In one embodiment, the detection apparatus may be embedded into a head supporting the substrate. Of course, the detection apparatus may be a stand alone unit. Other non-visible light detection sources, e.g., infrared light, UV light, etc., may be incorporated into the embodiments described herein. It should be appreciated that these techniques may be used to sense the marking through the wafer, e.g., where the wafer material is transparent to the detection source, or from the same side of the marking. In alternative embodiments, the sensor/reader may be integrated into an end effector, a substrate support, such as a process tool chuck, a metrology chuck, etc.

Figure 9:
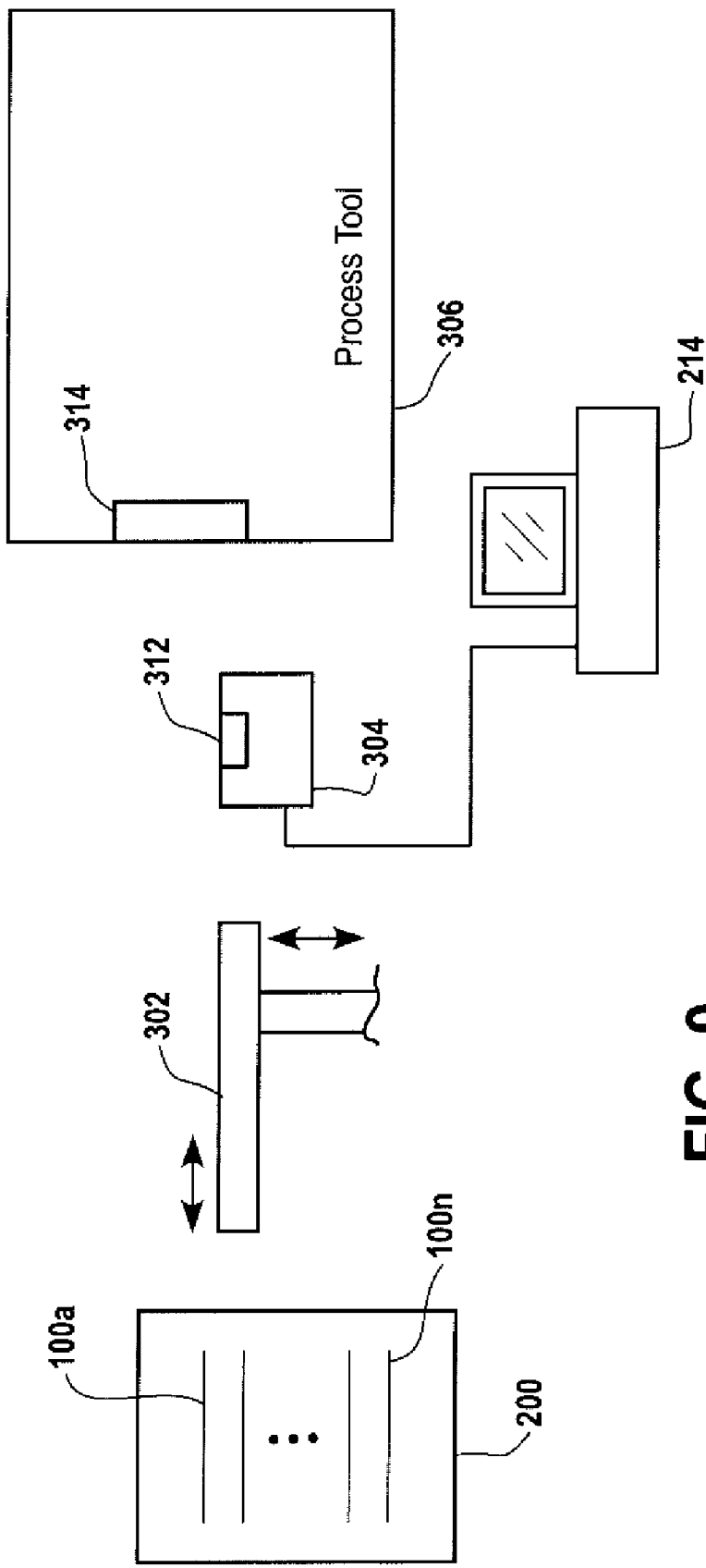
FIG. 9 is a simplified schematic diagram illustrating a system incorporating the embodiments described herein into a process flow in accordance with one embodiment of the invention.

FIG. 9 is a simplified schematic diagram illustrating a system incorporating the embodiments described herein into a process flow in accordance with one embodiment of the invention. Container 200 supports a plurality of substrates 100a through 100n. In one embodiment, container 200 is a front opening unified pod as described above, which can house up to 25 semiconductor substrates for processing. It should be appreciated that container 200 may house any number of substrates and is not limited to 25 substrates. In addition, container 200 may have cantilevered supports for substrates 100a through 100n, or alternatively, may support the substrates through a conventional support system where the outer edges of the substrates are supported. End effector 302 is configured to access substrates within container 200 in order to transport substrates to and from process tool 306. End effector 302 may be an edge grip end effector or a conventional end effector that supports a bottom surface of a substrate. It should be appreciated that end effector 302 and reading station 304 may be situated in an equipment front-end module (EFEM) in accordance with one embodiment of the invention. End effector 302 has the ability to move in an X and a Y plane in order to access each of the substrates 100a through 100n of container 200. In one embodiment, end effector 302 may also have sensing capabilities as described with reference to FIG. 8.

End effector 302 of FIG. 9 will obtain a substrate from container 200 and move the substrate to an entrance 314 of process tool 306. During the transition of the substrate from container 200 to process tool 306, the substrate will pass over reading station 304. Reading station 304 includes sensor 312 which has the capability to detect identification markings and/or fiducials as described above. The identification markings may be used to track specific wafers/substrates and/or dies on specific wafers/substrates in accordance with one embodiment. The fiducials can be used to position a wafer for the processing in process tool 306. That is, as the center of each substrate 100a through 100n is identified by reading station 304 through sensor 312, each substrate will be consistently placed within a support of process tool 306. This consistency will assist in the reproducibility of the process operations within process tool 306. As mentioned above, the chuck of the processing tool may also include a sensor/reading station. Reading station 304 is in communication with computing device 214 and in the path of travel of the substrate from the container to the processing tool.

Computing device 214 of FIG. 9 is capable of analyzing images captured through sensor 312 of the fiducials and/or identification markings on a surface of substrates 100a through 100n as the substrates pass over reading station 304. It should be appreciated that through the embodiments described with reference to FIG. 9, end effector 302 passes the semiconductor substrates over reading station 304 to obtain the identification and/or centering offsets, and then move the substrate into the process tool using the offset information to correct the position as the wafer is placed. In one embodiment, the substrate is placed on a substrate support or a chuck of a load lock or vacuum processing chamber of the process tool. In the embodiments described above, aligners are eliminated for all applications that do not require rotational orientation and the throughput would be enhanced. In another embodiment, reading station 304 is placed above the transport path of the substrate and the markings on the bottom surface are captured or read through the top surface of the substrate as described above.

Figure 10:
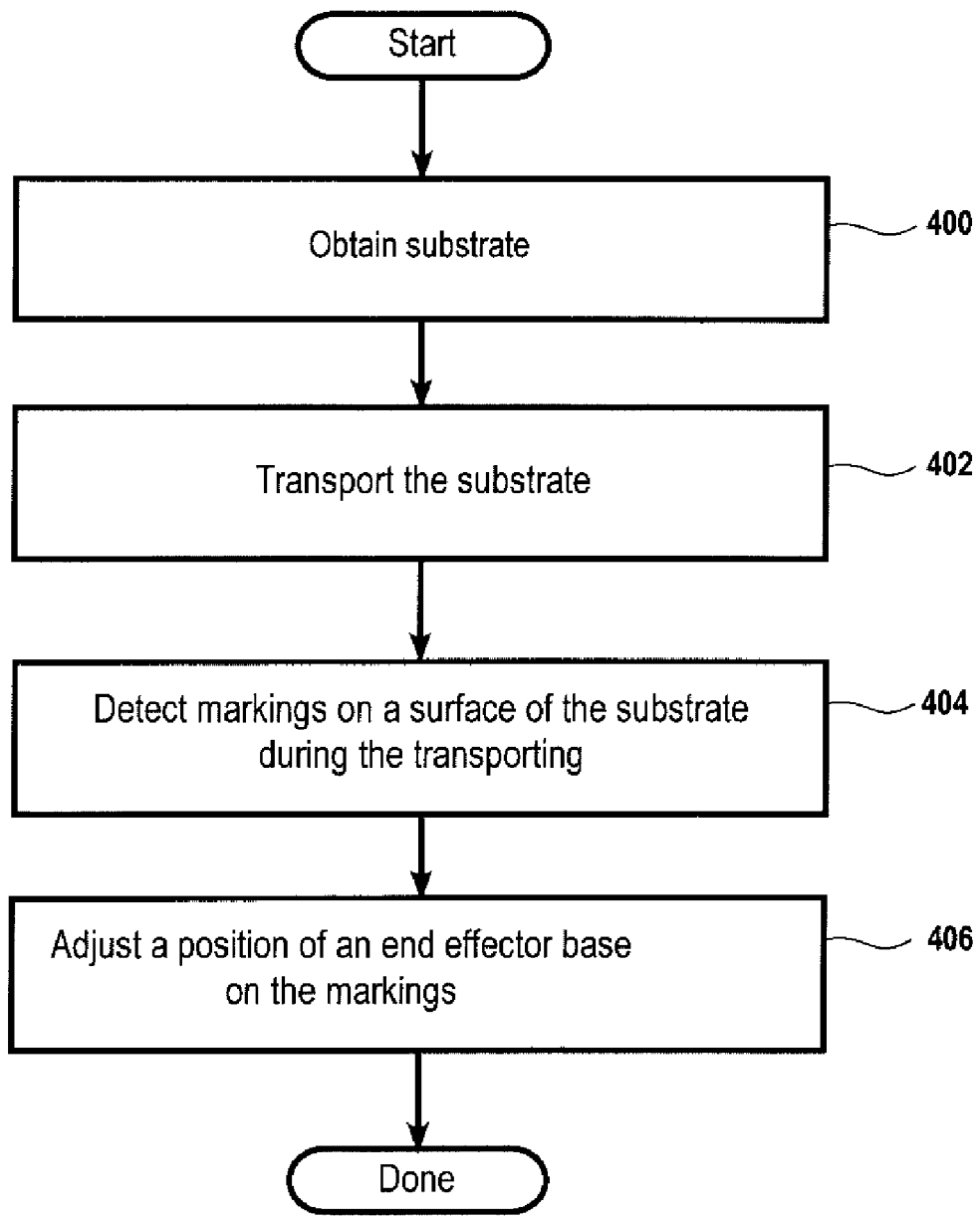
FIG. 10 is a flow chart diagram illustrating the method operations for transporting a substrate in accordance with one embodiment of the invention.

FIG. 10 is a flow chart diagram illustrating the method operations for transporting a substrate in accordance with one embodiment of the invention. The method initiates with operation 400 where a substrate is obtained. The substrate may be obtained through an end effector from a substrate container as illustrated in the embodiments described above. The substrate is then transported in operation 402. The substrate may be transported to or from a substrate container in one embodiment. During the transporting, a surface of the substrate is scanned by a reading station over which the substrate passes. In an alternative embodiment, the substrates can be scanned through a scan arm or a plurality of scan arms as described with regard to FIG. 8. In yet another embodiment, the end effector can include the sensor/reading station. The method then proceeds to operation 404 where center region markings are detected on the surface of the substrate through the reading station as the substrate is being transported. These center markings, such as the fiducials described above, indicate a center line and/or center point of the substrate being transported. In addition, identification marks provided within the center region or proximate thereto can be detected so that information relevant to the substrate (identification, lot number, etc.) can be monitored for processing and tracking purposes. In one embodiment, the marking is detected when the substrate is still, e.g., stops over the sensor during the transporting. In another embodiment, the substrate marking(s) may be detected as the substrate is being transported. It should be appreciated that the position information can then be processed in order to adjust a drop off position of an end effector transporting the substrate as indicated in operation 406. The end effector adjustment will then ensure repeated substrate drop off in a consistent position. It should be noted that the transport of the substrate eliminated the need for an aligner and the corresponding rotation performed by the aligner.

With the above embodiments in mind, it should be understood that the invention may employ various computer implemented operations involving data stored in computer systems. These operations are those requiring physical manipulation of physical quantities. Usually, though not necessarily, these quantities take the form of electrical and/or magnetic signals capable of being stored, transferred, combined, compared, and otherwise manipulated. Further, the manipulations performed are often referred to in such terms as producing, identifying, determining, or comparing.

The invention can also be embodied as computer readable medium on which contains computer readable code. The computer readable medium is any data storage device that can store data which can be thereafter read by a computer system. The computer readable medium also includes hard drives, network attached storage, read-only memory, random access memory, magnetic tapes, and other optical and non-optical data storage devices. The computer readable medium can also be distributed over a network coupled computer system so that the computer readable code is stored and executed in a distributed fashion.

It should be further appreciated that while the embodiments described above have been described with reference to substrates for semiconductor processing operations, the embodiments may be extended to any suitable processing operation, such as flat panel display processing, etc. Thus, the embodiments described above enable a marking within a center region that is easily identifiable and eliminates the undesirable features with edge exclusion marking. The embodiments further identify an orientation of the wafer in addition to identifying the wafer. In one embodiment an inspection station will include a sensing device or element to ascertain the wafer identification from the marking. Storage points within the transfer system may include the sensing element to provide tracking of the substrate during all processing operations. As described above, the identification placed within a center region of the back side or front side of the substrate enables identification without the need for pre-alignment, which is necessary with today's perimeter-based alphanumeric codes.

Any of the operations described herein that form part of the invention are useful machine operations. The invention also relates to a device or an apparatus for performing these operations. The apparatus can be specially constructed for the required purpose, or the apparatus can be a general-purpose computer selectively activated, implemented, or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

The invention claimed is:

1. A substrate transport system, comprising:
   a substrate having a marking located within a central region of a surface of the substrate, the marking identifying a center point of the substrate, wherein the marking includes one or more first fiducial element indicating a center point, and one or more second fiducial element indicating an angular orientation of the substrate;
   a transport mechanism for transporting the substrate over a transport path;
   a sensing element configured to capture the marking from the surface of the substrate; and
   a computing device configured to process the captured marking to identify the center point.

2. The system of claim 1, wherein the marking identifies one of an angular orientation of the substrate or a unique identifier of the substrate.

3. The system of claim 2, wherein the angular orientation indicates a crystallographic orientation.

4. The system of claim 1, wherein the computing device and the sensing element are integrated into a single unit.

5. A semiconductor substrate, comprising;
   a first surface and an opposing second surface, wherein the first surface includes a marking in a centroid region of the first surface, the marking indicating one of a location of a center point on the first surface of the semiconductor substrate or identification data unique to the substrate; and a second marking in the centroid region indicating an angular orientation of the semiconductor substrate.

6. The semiconductor substrate of claim 5, wherein the second marking indicates the angular orientation with respect to the crystallographic orientation of the semiconductor material.

7. The semiconductor substrate of claim 5 wherein the marking indicates an angular orientation of the semiconductor substrate and wherein the marking is disposed within a recess defined on the first surface.

8. The semiconductor substrate of claim 5, wherein the marking includes two parallel lines on opposing sides of a centerline of the semiconductor substrate, the centerline within a plane of the semiconductor substrate.

9. A device configured to read semiconductor substrate markings, comprising:
a sensor located within a support member and positioned to capture the markings on a center region of a surface of a semiconductor substrate, wherein the markings provide a unique identifier of the semiconductor substrate, wherein the support member is an end effector and the sensor is located within a recess of a surface of the support member.

10. The device of claim 9, wherein the sensor includes an image capture device configured to capture images of the surface of the semiconductor substrate, and wherein the sensor is in communication with a computing device having image recognition logic configured to process the captured images to determine one of a location of a center point of the substrate or an angular orientation of the substrate.

11. The device of claim 10, wherein the sensor includes a light source configured to illuminate the surface of the semiconductor substrate.

12. The device of claim 11, wherein a diffuser is disposed over the light source.

13. The device of claim 9, wherein the sensor is positioned to scan across a top surface of the substrate to access markings on a bottom surface of the substrate.

14. The device of claim 9, wherein the sensor is located within a recess on a surface of a semiconductor substrate support and wherein the semiconductor substrate support is one of a process chuck, a metrology chuck or a process tool chuck.

15. The device of claim 14, wherein the semiconductor substrate support is rotatable.

16. The device of claim 14, wherein the semiconductor substrate support is disposed within an aligner for a semiconductor processing tool.

17. The device of claim 9, wherein the markings include a single fiducial for identifying the center point and a pair of fiducials for identifying an angular orientation.

18. The device of claim 9, wherein the sensor includes an image capture device.

19. A method for transporting a substrate, comprising:
obtaining the substrate from a substrate container;
transporting the substrate from the substrate container wherein a center region of a surface of the substrate passes over a sensor, the transporting including,
reading position indicating markings on the center region of the surface of the substrate, wherein the reading of the position indicating markings is performed without rotation of the substrate and wherein a drop off position to the processing tool is adjusted based on the identified center point; and
identifying a center point of the substrate from the position indicating markings.

20. The method of claim 19, wherein the position indicating markings include first and second sets of fiducials, the first set including a single fiducial indicating a center point of the substrate and the second set including a pair of fiducials indicating an angular orientation of the substrate and wherein a drop off position to the processing tool is adjusted based on the identified center point.

21. The method of claim 19, further comprising:
reading unique identifiers on the center region of the surface of the substrate; and
adjusting a drop off position to the processing tool based on the identified center point.

22. The method of claim 19, wherein the reading is performed through an opposing surface to the surface having the position indicating markings.

23. A method for marking a semiconductor substrate, comprising:
identifying one of a center point of the substrate or a crystallographic plane of the substrate; and
generating a marking indicating a location of one of the center point, an angular orientation relative to the crystallographic plane or a unique identifier, the marking located in a center region of a surface of the semiconductor substrate, wherein the generating includes creating a recess in the center region, and imprinting the marking in the recess.

24. The method of claim 23, wherein identifying the crystallographic plane includes receiving x ray, electron beam or optical energy from the surface of the semiconductor substrate.

25. The method of claim 23, further comprising:
defining a notch on an outer periphery of the substrate, the notch correlated to the crystallographic plane.

26. The method of claim 23, wherein identifying the crystallographic plane of the substrate includes reading a notch on a periphery of the substrate.

* * * * *